(12) United States Patent
Chu et al.

(10) Patent No.: US 8,299,629 B2
(45) Date of Patent: Oct. 30, 2012

(54) WAFER-BUMP STRUCTURE

(75) Inventors: Kuei-Wu Chu, Taoyuan County (TW); Tse Ming Chu, Taipei (TW)

(73) Assignee: Aflash Technology Co., Ltd., Luzhu Township, Taoyuan County (TW)

( * ) Notice: Subject to any disclaimer, the term of this patent is extended or adjusted under 35 U.S.C. 154(b) by 59 days.

(21) Appl. No.: 13/083,745

(22) Filed: Apr. 11, 2011

(65) Prior Publication Data

US 2011/0260300 A1    Oct. 27, 2011

(30) Foreign Application Priority Data

Apr. 22, 2010 (TW) ............................ 99207376 U

(51) Int. Cl.
    *H01L 23/52*      (2006.01)
    *H01L 23/48*      (2006.01)
    *H01L 29/40*      (2006.01)

(52) U.S. Cl. ............... 257/781; 257/E23.021; 257/778; 257/780

(58) Field of Classification Search ........... 257/E23.002, 257/E23.02, E23.021, E23.022, 632, 737, 257/778–783, 785, 786; 438/108, 612, 614, 438/666
See application file for complete search history.

(56) References Cited

U.S. PATENT DOCUMENTS

| | | | | |
|---|---|---|---|---|
| 3,821,785 A * | 6/1974 | Rose | .............................. | 257/751 |
| 3,986,255 A * | 10/1976 | Mandal | .............................. | 29/840 |
| 4,205,099 A * | 5/1980 | Jones et al. | ..................... | 438/614 |
| 4,970,571 A * | 11/1990 | Yamakawa et al. | ........... | 257/737 |
| 5,134,460 A * | 7/1992 | Brady et al. | .................. | 257/737 |
| 5,461,261 A * | 10/1995 | Nishiguchi | .................... | 257/781 |
| 5,466,635 A * | 11/1995 | Lynch et al. | .................. | 438/614 |
| 5,738,931 A * | 4/1998 | Sato et al. | ..................... | 428/209 |
| 6,028,011 A * | 2/2000 | Takase et al. | ................. | 438/745 |
| 6,387,801 B1 * | 5/2002 | Lee | ................. | 438/678 |
| 6,413,851 B1 * | 7/2002 | Chow et al. | .................... | 438/613 |
| 6,420,255 B1 * | 7/2002 | Takahashi | ..................... | 438/613 |
| 6,433,426 B1 * | 8/2002 | Ikegami | ..................... | 257/737 |
| 6,518,162 B2 * | 2/2003 | Ono et al. | ..................... | 438/612 |
| 6,566,239 B2 * | 5/2003 | Makino et al. | ................ | 438/612 |
| 6,653,235 B2 * | 11/2003 | Liang et al. | ................... | 438/687 |
| 6,689,639 B2 * | 2/2004 | Sakuyama et al. | ............ | 438/118 |
| 6,753,253 B1 * | 6/2004 | Takahashi et al. | ............. | 438/676 |
| 6,759,599 B2 * | 7/2004 | Tatoh et al. | .................... | 174/261 |
| 6,809,020 B2 * | 10/2004 | Sakurai et al. | ................ | 438/613 |
| 6,812,124 B2 * | 11/2004 | Weng | ............................ | 438/613 |
| 6,858,941 B2 * | 2/2005 | Ference et al. | ................ | 257/781 |
| 6,924,553 B2 * | 8/2005 | Ohara | ............................ | 257/738 |
| 6,930,399 B2 * | 8/2005 | Paik et al. | ..................... | 257/783 |

(Continued)

*Primary Examiner* — Chris Chu

(74) *Attorney, Agent, or Firm* — Muncy, Geissler, Olds & Lowe, PLLC

(57) ABSTRACT

A wafer-bump structure includes a wafer-state semiconductor die, a pre-treatment layer, a first ENIG laminate and at least one pillar bump. The wafer-state semiconductor die includes at least one die pad embedded therein and a passivation layer formed on the wafer-state semiconductor die and the die pad. The passivation layer includes an aperture for allowing access to a portion of the die pad. The pre-treatment layer is formed on the un-covered portion of the die pad. The first ENIG laminate is formed on the pre-treatment layer and an annular portion of the passivation layer around the pre-treatment layer. The pillar bump includes a conductive metal layer and a second ENIG laminate. The conductive metal layer is formed on the first ENIG laminate and another annular portion of the passivation layer around the first ENIG laminate. The second ENIG laminate is formed on the conductive metal layer and another annular portion of the passivation layer around the conductive metal layer.

9 Claims, 2 Drawing Sheets

U.S. PATENT DOCUMENTS

| | | | |
|---|---|---|---|
| 6,974,776 B2 * | 12/2005 | Dean et al. | 438/678 |
| 7,007,834 B2 * | 3/2006 | Zakel | 228/56.3 |
| 7,081,372 B2 * | 7/2006 | Lo | 438/106 |
| 7,174,631 B2 * | 2/2007 | Hsu et al. | 29/848 |
| 7,638,421 B2 * | 12/2009 | Tanida et al. | 438/614 |
| 7,968,446 B2 * | 6/2011 | Yu | 438/614 |
| 8,022,508 B2 * | 9/2011 | Miki | 257/620 |
| 8,187,965 B2 * | 5/2012 | Lin et al. | 438/617 |

* cited by examiner

WAFER-BUMP STRUCTURE

BACKGROUND OF INVENTION

1. Field of Invention

The present invention relates to a wafer-bump structure and, more particularly, to a wafer-bump structure made in a process including the steps of zincating and electroless nickel/immersion gold ("ENIG") instead of the step of under-bump metallization ("UBM") and including the step of forming a pillar bump by printing conductive metal paste instead of electroplating gold, thus improving soldering thereof to other devices and reducing the cost thereof.

2. Related Prior Art

Referring to FIG. 2, there is shown a conventional wafer-bump structure 5 made in a conventional under-bump metallization process. The wafer-bump structure 5 includes a semiconductor die 50, an under-bump metal layer 60 and a pillar bump 70. The semiconductor die 50 is formed with a surface 501. At least one die pad 51 is embedded in the semiconductor die 50. A passivation layer 52 is formed on the surface 501 of the semiconductor die 50 and a surface of the die pad 51. The passivation layer 52 includes at least one aperture for allowing access to a portion of the surface of the die pad 51.

In the making of the conventional wafer-bump structure 5, the under-bump metallization process is executed to provide the die pad 51. The cost of the conventional under-bump metallization process is high while the yield of the conventional under-bump metallization process is low. Moreover, in the making of the conventional wafer-bump structure 5, a gold-electroplating process is used to form the pillar bump 70. The gold-electroplating process is however expensive, and the resultant pillar bump 70 is expensive for being made of gold entirely. This problem is getting worse since the price of gold is skyrocketing.

The present invention is therefore intended to obviate or at least alleviate the problems encountered in prior art.

SUMMARY OF INVENTION

It is the primary objective of the present invention to provide an inexpensive wafer-bump structure.

To achieve the foregoing objective, the wafer-bump structure includes a wafer-state semiconductor die, a pre-treatment layer, a first electrodeless nickel/immersion gold laminate and at least one pillar bump. The wafer-state semiconductor die includes at least one die pad embedded therein and a passivation layer formed on the wafer-state semiconductor die and the die pad. The passivation layer includes an aperture for allowing access to a portion of the die pad. The pre-treatment layer is formed on the portion of the die pad not covered by the passivation layer. The first electrodeless nickel/immersion gold laminate is formed on the pre-treatment layer and an annular portion of the passivation layer around the pre-treatment layer. The pillar bump includes a conductive metal layer and a second electrodeless nickel/immersion gold laminate. The conductive metal layer is formed on the first electrodeless nickel/immersion gold laminate and another annular portion of the passivation layer around the first electrodeless nickel/immersion gold laminate. The second electrodeless nickel/immersion gold laminate is formed on the conductive metal layer and another annular portion of the passivation layer around the conductive metal layer.

Other objectives, advantages and features of the present invention will be apparent from the following description referring to the attached drawings.

BRIEF DESCRIPTION OF DRAWINGS

The present invention will be described via detailed illustration of the preferred embodiment versus the prior art referring to the drawings wherein.

DETAILED DESCRIPTION OF PREFERRED EMBODIMENT

Figure 1:
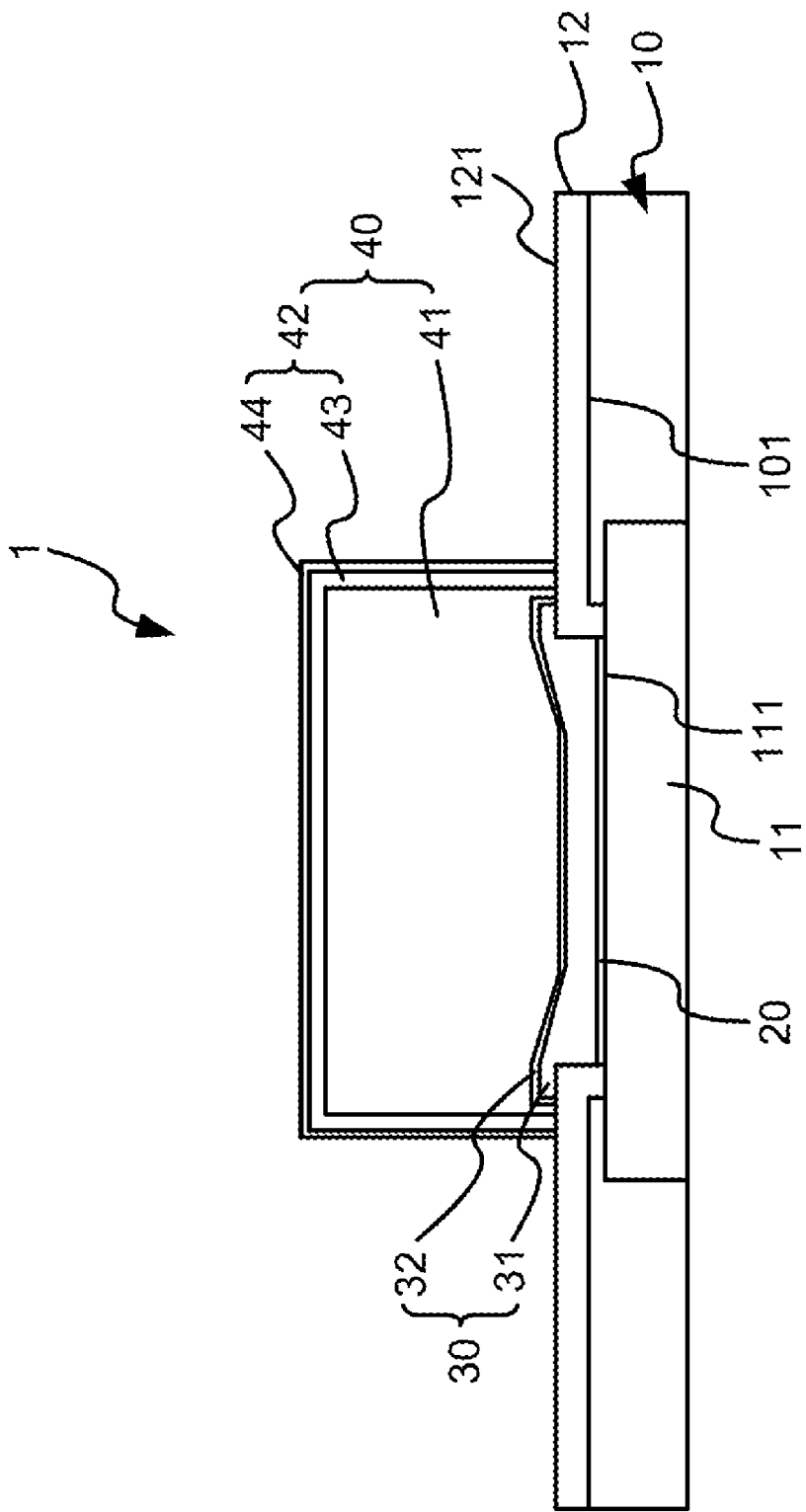
FIG. 1 is a cross-sectional view of a wafer-bump structure according to the preferred embodiment of the present invention.
Figure 2:
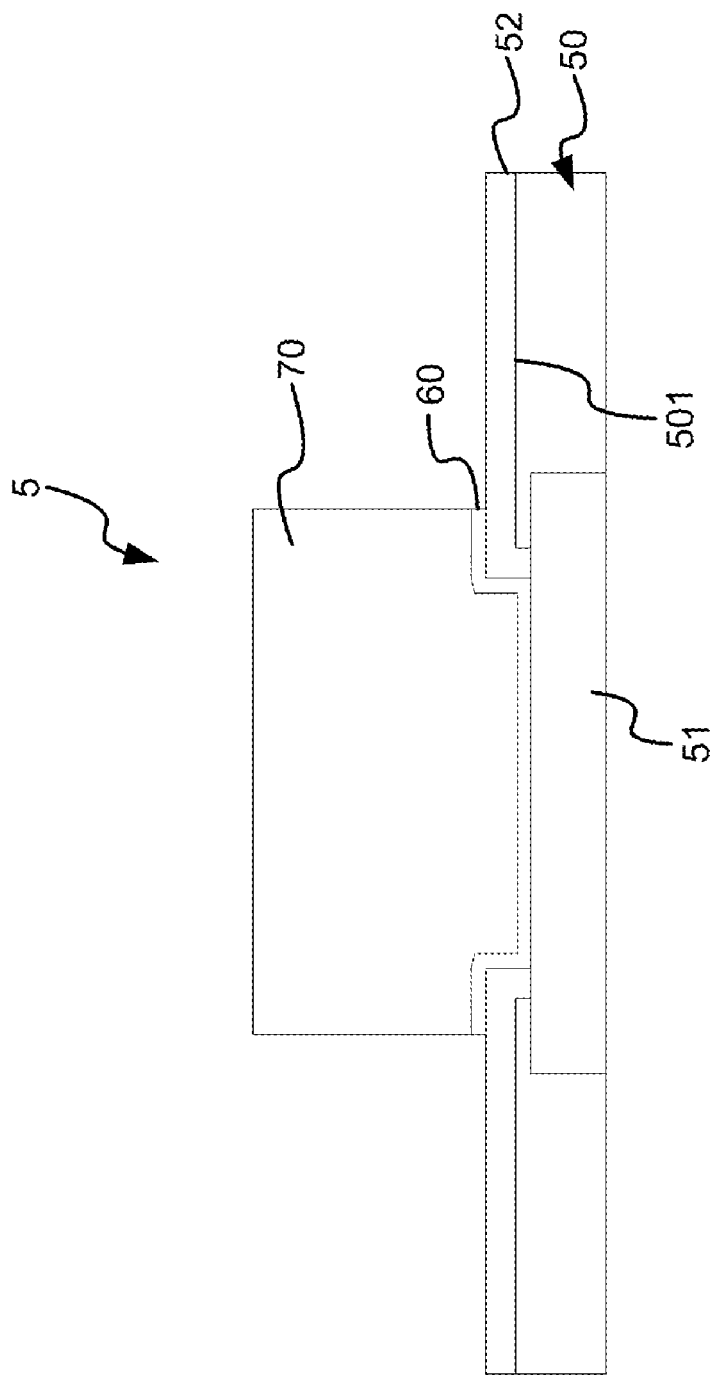
FIG. 2 is a cross-sectional view of a conventional wafer-bump structure.

Referring to FIG. 1, there is shown a wafer-bump structure 1 according to the preferred embodiment of the present invention. The wafer-bump structure 1 includes a wafer-state semiconductor die 10, a pre-treatment layer 20, a first electrodeless nickel/immersion gold laminate 30 and at least one pillar bump 40.

The wafer-state semiconductor die 10 is formed with a surface 101. At least one die pad 11 is embedded in the semiconductor die 10. A passivation layer 12 is formed on the surface 101 of the semiconductor die 10 and a surface 111 of the die pad 11. The passivation layer 12 includes at least one aperture for allowing access to a portion of the surface 111 of the die pad 11.

The pre-treatment layer 20 is formed on the portion of the surface 111 of the die pad 11 that is not covered by the aperture defined in the passivation layer 12. The pre-treatment layer 20 is an anti-erosion layer made in a zincating process.

The first electrodeless nickel/immersion gold laminate 30 is formed on the pre-treatment layer 20 and an annular region of a surface 121 of the passivation layer 12 around the aperture defined in the passivation layer 12. The first electrodeless nickel/immersion gold laminate 30 is an anti-erosion layer made by an electroless nickel/immersion gold ("ENIG") process. The first electrodeless nickel/immersion gold laminate 30 includes a nickel layer 31 and a gold layer 32 extending on the nickel layer 31.

The pillar bump 40 includes a conductive metal layer 41 and a second electrodeless nickel/immersion gold laminate 42. The pillar bump 40 improves soldering thereof to another electronic device.

The conductive metal layer 41 extends on the first electrodeless nickel/immersion gold laminate 30 and another annular portion of the surface 121 of the passivation layer 12 around the nickel/immersion gold laminate 30. The conductive metal layer 41 is made of conductive silver paste or any other proper conductive metal paste by printing. The conductive metal layer 41 avoids deterioration of adhesion.

The second electrodeless nickel/immersion gold laminate 42 is used as an anti-erosion layer. The second electrodeless nickel/immersion gold laminate 42 is also made in an ENIG process. Therefore, the second electrodeless nickel/immersion gold laminate 42 includes a nickel layer 43 and a gold layer 44. The nickel layer 43 extends on the conductive metal layer 41 and another annular portion of the surface 121 of the passivation layer 12 around the conductive metal layer 41. The gold layer 44 extends on the nickel layer 43 and another annular portion of the surface 121 of the passivation layer 12 around the nickel layer 43. The second electrodeless nickel/ immersion gold laminate 42 may include any other materials that improve the wetting of solder that is used to connect the wafer-state semiconductor die 10 to another electronic device.

In making the wafer-bump structure 1, based on whether the surface 101 of the semiconductor die 10 is provided with the passivation layer 12 or not, the passivation layer 12 is provided. If the surface 101 of the semiconductor die 10 is provided with the passivation layer 12, the passivation layer 12 will not be provided.

As discussed above, according to the present invention, the pre-treatment layer 20 is made in the zicating process and the first electrodeless nickel/immersion gold laminate 30 is made in the ENIG process instead of an under-bump metallization process of which the yield is low but the cost is high. An under-bump metallization process may however be executed. Moreover, the conductive metal layer 41 is made of conductive metal paste by in the printing process and the second electrodeless nickel/immersion gold laminate 42 is made by the ENIG process instead of a gold layer made by a gold-coating process of which the yield is low but the cost is high.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A wafer-bump structure including:
 a wafer-state semiconductor die including:
  at least one die pad embedded therein; and a passivation layer formed on the wafer-state semiconductor die and the die pad, wherein the passivation layer includes an aperture for allowing access to a portion of the die pad;
 a pre-treatment layer formed on the portion of the die pad not covered by the passivation layer;
 a first electrodeless nickel/immersion gold laminate formed on the pre-treatment layer and an annular portion of the passivation layer around the pre-treatment layer; and
 at least one pillar bump including:
  a conductive metal layer formed on the first electrodeless nickel/immersion gold laminate and another annular portion of the passivation layer around the first electrodeless nickel/immersion gold laminate; and
  a second electrodeless nickel/immersion gold laminate formed on the conductive metal layer and another annular portion of the passivation layer around the conductive metal layer.

2. The wafer-bump structure according to claim 1, wherein the pre-treatment layer is an anti-erosion layer made in a zincating process.

3. The wafer-bump structure according to claim 1, wherein the first electrodeless nickel/immersion gold laminate is an anti-erosion layer made in an electroless nickel/immersion gold process.

4. The wafer-bump structure according to claim 1, wherein the first electrodeless nickel/immersion gold laminate 30 includes a nickel layer and a gold layer extending on the nickel layer.

5. The wafer-bump structure according to claim 1, wherein the conductive metal layer is made in a printing process.

6. The wafer-bump structure according to claim 1, wherein the conductive metal layer is made of conductive metal paste.

7. The wafer-bump structure according to claim 1, wherein the conductive metal paste is silver paste.

8. The wafer-bump structure according to claim 1, wherein the second electrodeless nickel/immersion gold laminate is made in an electrodeless nickel/immersion gold process.

9. The wafer-bump structure according to claim 1, wherein the second electrodeless nickel/immersion gold laminate includes a nickel layer and a gold layer extending on the nickel layer.

\* \* \* \* \*